(12) United States Patent
Wang et al.

(10) Patent No.: US 10,475,512 B2
(45) Date of Patent: Nov. 12, 2019

(54) OPERATION METHOD OF RESISTIVE RANDOM ACCESS MEMORY AND RESISTIVE RANDOM ACCESS MEMORY DEVICE

(71) Applicant: Tsinghua University, Beijing (CN)

(72) Inventors: Chen Wang, Beijing (CN); Huaqiang Wu, Beijing (CN); He Qian, Beijing (CN); Bin Gao, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 15/776,520

(22) PCT Filed: Dec. 22, 2016

(86) PCT No.: PCT/CN2016/111401
§ 371 (c)(1),
(2) Date: May 16, 2018

(87) PCT Pub. No.: WO2017/124873
PCT Pub. Date: Jul. 27, 2017

(65) Prior Publication Data
US 2018/0330788 A1    Nov. 15, 2018

(30) Foreign Application Priority Data

Jan. 22, 2016   (CN) .......................... 2016 1 0045713

(51) Int. Cl.
*G11C 11/00*   (2006.01)
*G11C 13/00*   (2006.01)

(52) U.S. Cl.
CPC ...... *G11C 13/0097* (2013.01); *G11C 13/0064* (2013.01); *G11C 2013/0092* (2013.01); *G11C 2213/79* (2013.01); *G11C 2213/82* (2013.01)

(58) Field of Classification Search
CPC ............ G11C 13/0069; G11C 13/0004; G11C 13/0007; G11C 2213/3179; G11C 2213/72
(Continued)

(56) References Cited

U.S. PATENT DOCUMENTS

2004/0174739 A1   9/2004  Morimoto et al.
2008/0062740 A1*  3/2008  Baek .................. G11C 13/0007
                                                              365/148
(Continued)

FOREIGN PATENT DOCUMENTS

CN          101118784         2/2008
CN          101755306         6/2010
(Continued)

OTHER PUBLICATIONS

International Search Report for International Application No. PCT/CN2016/111401, dated Mar. 22, 2017, 12 pages.
(Continued)

*Primary Examiner* — Son T Dinh
(74) *Attorney, Agent, or Firm* — Fish & Richardson P.C.

(57) ABSTRACT

An operation method of a resistance random access memory and a resistance random access memory apparatus are provided. The method includes: applying an initial reset voltage to a storage unit; carrying out a read check operation to acquire a resistance value of the storage unit; judging whether the resistance value of the storage unit reaches a preset target resistance value in a high resistance state; if the resistance value of the storage unit is less than the preset target resistance value in the high resistance state, applying a set voltage to the storage unit to set the storage unit to a preset target resistance value in a low resistance state, then applying a reset voltage of which an amount is increased to the storage unit, and repeating the read check operation and
(Continued)

the subsequent steps until the storage unit reaches the preset target resistance value in the high resistance state.

19 Claims, 4 Drawing Sheets

(58) Field of Classification Search
USPC .......................................... 365/148, 158, 163
See application file for complete search history.

(56) References Cited

U.S. PATENT DOCUMENTS

| | | | |
|---|---|---|---|
| 2012/0188813 A1* | 7/2012 | Chien | G11C 7/1045 |
| | | | 365/148 |
| 2013/0058153 A1* | 3/2013 | Chang | G11C 13/0007 |
| | | | 365/148 |
| 2014/0140125 A1 | 5/2014 | Mae et al. | |

FOREIGN PATENT DOCUMENTS

| | | |
|---|---|---|
| CN | 101828235 | 9/2010 |
| CN | 102420014 | 4/2012 |
| CN | 103366816 | 10/2013 |
| CN | 104778968 | 7/2015 |
| CN | 105719691 | 6/2016 |

OTHER PUBLICATIONS

International Preliminary Report on Patentability for International Application No. PCT/CN2016/111401, dated Jul. 24, 2018, 8 pages.
The State Intellectual Property Office of People's Republic of China, English translation of the First Office Action for CN Application No. 201610045713.9, dated May 17, 2018, 26 pages.
The State Intellectual Property Office of People's Republic of China, English translation of the Second Office Action for CN Application No. 201610045713.9, dated May 17, 2018, 25 pages.

* cited by examiner

OPERATION METHOD OF RESISTIVE RANDOM ACCESS MEMORY AND RESISTIVE RANDOM ACCESS MEMORY DEVICE

CLAIM OF PRIORITY

This application is a U.S. national stage application under 35 USC § 371 of International Application No. PCT/CN2016/111401, filed on Dec. 22, 2016, which claims priority to CN Patent Application No. 201610045713.9, filed on Jan. 22, 2016. The entire contents of each application is hereby incorporated by reference.

TECHNICAL FIELD

Embodiments of the present disclosure relate to an operation method of a resistance random access memory and an apparatus comprising the resistance random access memory.

BACKGROUND

Resistance Random Access Memory (RRAM) becomes a research hotspot of the next generation nonvolatile memory technology, due to its advantages of high speed, high capacity, low power consumption and the like.

Data retention ability of the resistance random access memory is one of important factors for judging performance of the resistance random access memory. After an erasing operation is carried out on the resistance random access memory, a resistance value of the resistance random access memory may reduce rapidly in a short time. Such phenomenon is called as a resistance relaxation behavior of the resistance random access memory. The resistance relaxation behavior will seriously influence the data retention ability of the resistance random access memory, enables a window between high resistance value and low resistance value to be narrowed and even disappear, and causes a function failure of the resistance random access memory.

SUMMARY

Embodiments of the disclosure provided an operation method of a resistance random access memory. The method comprises steps of: applying an initial reset voltage to a storage unit of a resistance random access memory array; carrying out a read check operation to acquire a resistance value of the storage unit; judging whether the resistance value of the storage unit reaches a preset target resistance value in a high resistance state; if the resistance value of the storage unit is greater than or equal to the preset target resistance value in the high resistance state, ending the method; and if the resistance value of the storage unit is less than the preset target resistance value in the high resistance state, applying a set voltage to the storage unit to set the storage unit to a preset target resistance value in a low resistance state, then applying a reset voltage of which an amount is increased to the storage unit, and repeating the read check operation and the subsequent steps until the storage unit reaches the preset target resistance value in the high resistance state.

In the embodiments of the disclosure, for example, the storage unit includes a resistance variable element and a nonlinear gating device, the nonlinear gating device is a transistor, and the reset voltage is applied by a word line end and a source line end of the storage unit.

In the embodiments of the disclosure, for example, if the resistance value of the storage unit is less than the preset target resistance value in the high resistance state, it is judged whether the reset voltage is greater than a maximum voltage of the source line; if the reset voltage is not greater than the maximum voltage of the source line, the set voltage is applied to the storage unit; and if the reset voltage is greater than the maximum voltage of the source line, the method is ended.

In the embodiments of the disclosure, for example, if the reset voltage of the storage unit is greater than the maximum voltage of the source line, it is determined that the storage unit does not pass test and then the method is ended.

In the embodiments of the disclosure, for example, the reset voltage of which the amount is increased is equal to a sum of the source line voltage and a step length.

In the embodiments of the disclosure, for example, the initial reset voltage is a pulse voltage, and a pulse width of the pulse voltage is 20 to 100 ns.

In the embodiments of the disclosure, for example, the pulse width of the pulse voltage is 40 to 60 ns.

In the embodiments of the disclosure, for example, the resistance random access memory array includes a plurality of storage units; and the initial reset voltage is a pulse voltage, and an amount of the pulse voltage is not greater than a maximum value of critical voltages of the plurality of storage units.

In the embodiments of the disclosure, for example, the resistance random access memory array includes a plurality of storage units; and the initial reset voltage is a pulse voltage, and a difference between an amount Vmax of the pulse voltage and a median Vmid of critical voltages of the plurality of storage units meets that: $-0.2V \leq V_{max} - V_{mid} \leq 0.1V$ In the embodiments of the disclosure, for example, the read check operation is that: a pulse voltage with an amount of 0.1 to 0.3 V is applied to the storage unit, a current of the storage unit is acquired, and the resistance value of the storage unit is calculated based on the pulse voltage and the current.

In the embodiments of the disclosure, for example, the read check operation is that: the pulse voltage with the amount of 0.2 to 0.25 V is applied to the storage unit.

In the embodiments of the disclosure, for example, the storage unit includes a resistance variable element and a nonlinear gating device, the nonlinear gating device is a transistor, and the set voltage is applied by a word line end and a bit line end of the storage unit.

In the embodiments of the disclosure, for example, an amount V2 of the set voltage applied to the storage unit and an amount V1 of the reset voltage applied to the storage unit before the set voltage with the amount V2 is applied meet that: $-0.4 \leq V2 - V1 \leq 0$.

In the embodiments of the disclosure, for example, the amount V2 of the set voltage applied to the storage unit and the amount V1 of the reset voltage applied to the storage unit before the set voltage with the amount V2 is applied meet that: $-0.2 \leq V2 - V1 \leq 0$.

In the embodiments of the disclosure, for example, if the resistance value of the storage unit is equal to the preset target resistance value in the high resistance state, it is determined that the storage unit passes test and the method is ended.

The embodiments of the disclosure provided a resistance random access memory apparatus. The apparatus comprises a resistance random access memory array, a control module and a test module. The control module controls the test module to apply a reset voltage to a storage unit of the resistance random access memory array; and the control module acquires a resistance value of the storage unit, compares the acquired resistance value of the storage unit with a preset target resistance value in a high resistance state, and carries out the following steps according to a comparison result: if the resistance value of the storage unit is less than the preset target resistance value in the high resistance state, the control module controls the test module to apply a set voltage to the storage unit so as to set the storage unit to a preset target resistance value in a low resistance state; the control module controls the test module to apply the reset voltage of which an amount is increased to the storage unit; and the control module and the test module repeat the step of acquiring the resistance value of the storage unit and the subsequent steps until the resistance value of the storage unit is greater than or equal to the preset target resistance value in the high resistance state; and if the resistance value of the storage unit is greater than or equal to the preset target resistance value in the high resistance state, the control module controls the test module to stop applying the reset voltage to the storage unit.

In the embodiments of the disclosure, for example, the storage unit includes a resistance variable element and a nonlinear gating device, and the nonlinear gating device is a transistor; and the reset voltage is applied by a word line end and a source line end of the storage unit, and the set voltage is applied by the word line end and a bit line end of the storage unit.

In the embodiments of the disclosure, for example, if the resistance value of the storage unit is less than the preset target resistance value in the high resistance state, the control module judges whether the reset voltage is greater than a maximum voltage of the source line; if the reset voltage is not greater than the maximum voltage of the source line, the control module controls the test module to apply the set voltage to the storage unit; and if the reset voltage is greater than the maximum voltage of the source line, the control module controls the test module to stop applying the reset voltage to the storage unit.

In the embodiments of the disclosure, for example, if the reset voltage is greater than the maximum voltage of the source line, the control module determines that the storage unit does not pass test and the test is ended.

In the embodiments of the disclosure, for example, the storage unit includes a resistance variable element and a nonlinear gating device, and the nonlinear gating device is a transistor or a diode.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
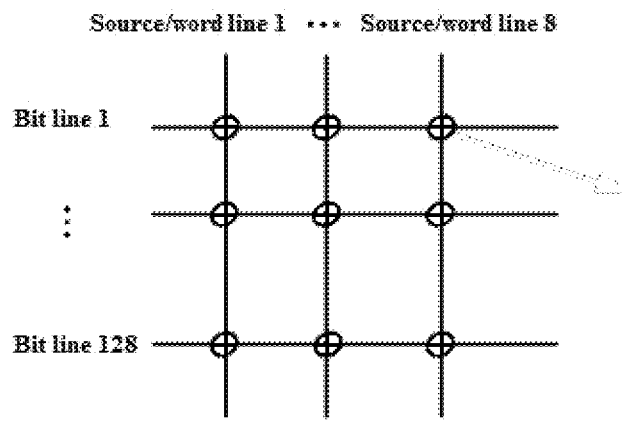
FIG. 1 is a structural schematic view of a resistance random access memory array.
Figure 2:
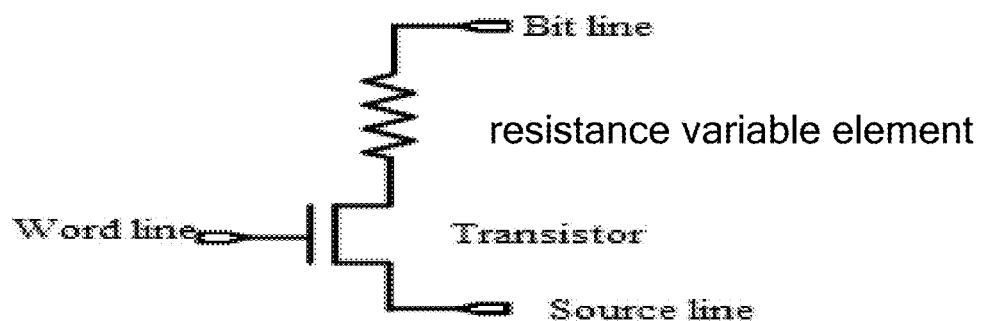
FIG. 2 is a structural schematic view of a storage unit of the resistance random access memory array.

A resistance random access memory, for example, is a resistance random access memory array formed by a storage unit comprising a nonlinear gating device and a resistance variable element. FIG. 1 shows the resistance random access memory array. With reference to FIG. 1, the resistance random access memory array, for example, comprises 8 word lines and 128 bit lines, which intersect with each other. One storage unit is arranged at an intersection of the bit line and the word line. FIG. 2 shows a structure of the storage unit at the intersection in the resistance random access memory array, and the storage unit is connected to the corresponding word line, source line and bit line. With reference to FIG. 2, each storage unit includes one resistance variable element and one transistor. A gate electrode of the transistor is connected with the word line, a source electrode of the transistor is connected with the source line, and a drain electrode of the transistor is connected to the bit line after being connected in series with the resistance variable element. The word line has an effect of applying a voltage to the transistor to turn on or turn off a channel of the transistor so as to control turn-on or turn-off of the transistor. After the transistor is turned on, for example, a voltage is applied to the resistance variable element in the storage unit by the source line or the bit line so as to control a resistance state of the resistance variable element.

It should be noted that structures of the resistance random access memory array and the storage unit shown in FIG. 1 and FIG. 2 merely are exemplary, but not intended to limit the present disclosure. For example, arrangement of rows and columns of the storage unit in the array is not limited to the situation shown in the drawings. For example, the nonlinear gating device in the storage unit is a diode.

The resistance variable element is a key component in the resistance random access memory array in the case that the resistance random access memory array is used for storing data. For example, the resistance variable element is of a sandwich structure, and includes a resistance variable layer and electrode layers positioned respectively on both sides of the resistance variable layer. The resistance variable layer, for example, is made of a metal oxide or an organic material. For example, in the case that the transistor is used as the gating device of the resistance random access memory, the electrode layers on both sides of the resistance variable layer are respectively connected with the drain electrode of the transistor and the bit line. The source electrode of the transistor is connected with the source line, and the gate electrode is connected with the word line. For example, in the case that the bit line and the word line simultaneously apply the voltages, a set operation is carried out. For example, in the case that the source line and the word line simultaneously apply the voltages, a reset operation is carried out. The gate electrode of the transistor has an effect of turning on the channel of the transistor by receiving the turn-on voltage from the word line, so that the voltage is applied to the resistance variable layer by electrode layers on both sides of the resistance variable layer. Therefore, in the structure using the transistor as the gating device, in order that the voltage is applied to the resistance variable layer, the channel of the transistor needs to be turned on firstly, i.e., the turn-on voltage needs to be applied to the gate electrode of the transistor by the word line.

A resistance value of the resistance variable element is changed along with an amount of the voltage applied to electrode layers of the resistance variable element, and two states of a low resistance state and a high resistance state appear, i.e., two operation processes comprise the setting operation and the resetting operation are included. The reset operation, for example, is a process of applying a reset voltage to the resistance variable layer of the resistance variable element by the electrode layers on both sides of the resistance variable layer to enable the resistance of the resistance variable layer to be gradually increased so as to proceed to the high resistance state. The set operation, for example, is a process of applying a set voltage contrary to the reset voltage to the resistance variable layer of the resistance variable element by the electrode layers on both sides of the resistance variable layer to enable the resistance of the resistance variable element to proceed to the low resistance state. It should be noted that, "the set voltage contrary to the reset voltage" means that electric field formed between the electrodes on both sides of the resistance variable layer during the set operation is contrary to electric field formed between the electrodes on both sides of the resistance variable layer during the reset operation in direction.

Figure 3:
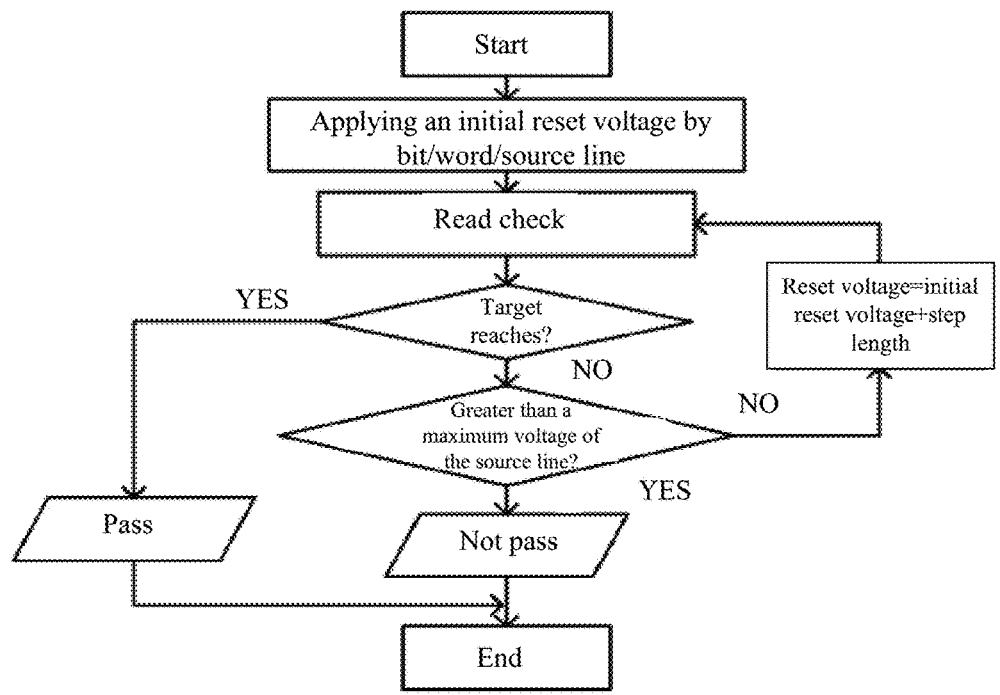
FIG. 3 is a flow chat of a reset operation of a resistance random access memory according to one technique.

For example, the resistance random access memory array adopts a gradually-increased pulse programming algorithm. FIG. 3 shows the resetting process of the resistance random access memory array. In the resistance random access memory array shown in FIG. 3, the resistance variable element of each storage unit is controlled by the transistor. With reference to FIG. 3, a manner of loading a pulse voltage to the resistance random access memory array is as follows. The resetting process of the resistance random access memory array is started, for example, an initial voltage value is applied to the storage unit of the resistance random access memory array by the word line and the source line, i.e., an initial pulse voltage is loaded by the source line terminal and the word line terminal of the storage unit. Subsequently, a read check operation is carried out, i.e., the resistance value of the storage unit is acquired. Then it is judged whether the resistance value of the storage unit reaches a preset target resistance value. If the resistance value of the storage unit is greater than or equal to the preset target resistance value, application of the pulse voltage to the storage unit is stopped, and for example, as shown in FIG. 3, the test is determined to be passed and the test is ended, i.e., application of the pulse voltage to the storage unit is stopped. If the resistance value of the storage unit is less than the preset target resistance value, whether the voltage value applied to the storage unit is greater than a maximum voltage of the source line is further judged; if the voltage value applied to the storage unit is greater than the maximum voltage of the source line, application of the pulse voltage to the storage unit is stopped, and as shown in FIG. 3, the test is determined not to be passed and then the test is ended, i.e., application of the pulse voltage to the storage unit is stopped; and if the voltage value applied to the storage unit is not greater than the maximum voltage of the source line, the amount of the pulse voltage is increased (generally in a mode of adding a step length to the initial voltage value), and the storage unit is again loaded with the pulse voltage by the source line, and the read check operation and the subsequent operations are repeated, until the resistance value of the storage unit reaches the preset target value or the test is ended in other modes.

It should be noted that in the resetting process of the resistance random access memory array, the word line voltage has the effect of turning on the channel of the transistor so that the voltage is applied to resistance variable element by the source line. The initial voltage value applied by the source line, the step length adding to the initial voltage value and a final voltage value applied by the source line are determined according to characteristics of the resistance variable element in the storage unit. Widths of the word line pulse voltage and the source line pulse voltage are selected according actual demands. The preset target resistance value is the resistance value of the storage unit in the high resistance state, and the preset target resistance value is determined according to the characteristics of the resistance random access memory array.

For the operation of carrying out resetting programming on each storage unit in the resistance random access memory array by adopting the above-mentioned algorithm, the inventors of the disclosure note that the relaxation behavior of the resistance random access memory has a great influence on the erasing operation (i.e. resetting operation). In the case that the amount of pulse voltage applied by the source line is increased to about a critical pulse voltage, the resistance value of the corresponding storage unit is suddenly changed. The sharply increased resistance value causes a sharp reducing of an internal temperature of the resistance variable layer of the storage unit, so that a movement speed of oxygen ions in the resistance variable layer is reduced, and the oxygen ions do not effectively combined with oxygen vacancies to form the stable high resistance state. Meanwhile, the oxygen vacancies capture electrical charges so as to form an instable high resistance value in the resistance variable layer of the storage unit to cause the high resistance state rapid relaxation phenomenon.

Aiming at the above-mentioned high resistance state rapid relaxation phenomenon, embodiments of the present disclosure provide an operation method of a resistance random access memory and a resistance random access memory apparatus.

Figure 4:
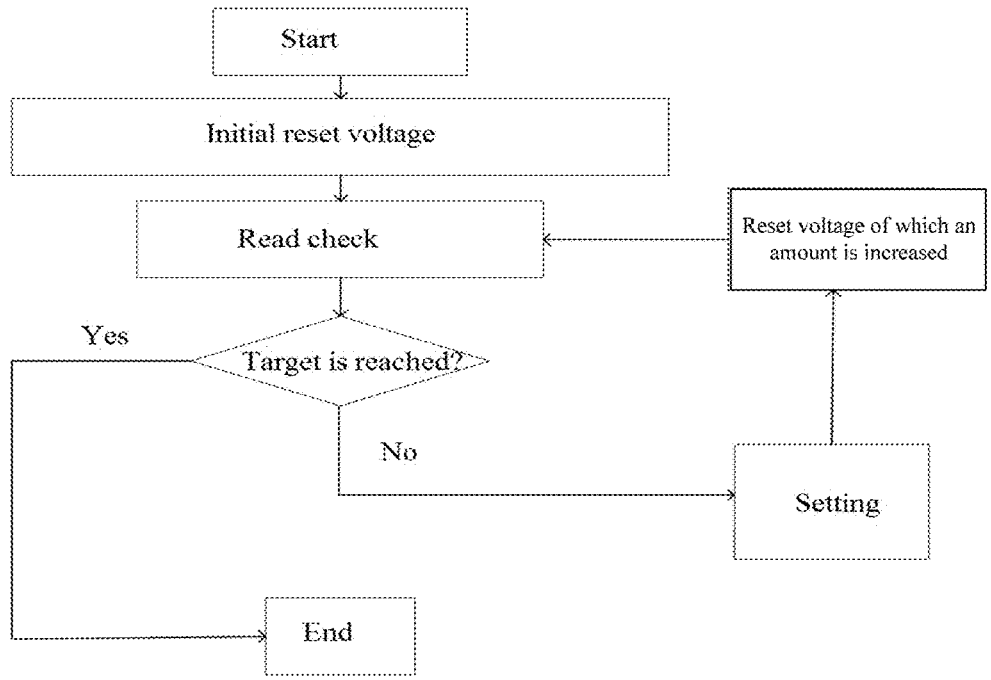
FIG. 4 is a flow chat of a reset operation method of a resistance random access memory according to embodiments of the present disclosure.

In one aspect, the embodiments of the present disclosure provide the operation method of the resistance random access memory. With reference to FIG. 4, the operation method of the resistance random access memory, which is provided by the embodiments of the disclosure, includes steps of: applying an initial reset voltage to a storage unit in a resistance random access memory array; carrying out a read check operation to acquire a resistance value of the storage unit; judging whether the resistance value of the storage unit reaches a preset target resistance value in a high resistance state; if the resistance value of the storage unit is greater than or equal to the preset target resistance value in the high resistance state, ending the method; and if the resistance value of the storage unit is less than the preset target resistance value in the high resistance state, applying a set voltage to the storage unit to set the storage unit to a preset target resistance value in a low resistance state, then applying a reset voltage of which an amount is increased to the storage unit, and repeating the read check operation and the subsequent steps until the storage unit reaches the preset target resistance value in the high resistance state.

According to the operation method of the resistance random access memory, which is provided by the embodiments of the present disclosure, the storage unit is set to be in the low resistance state before a new reset voltage is applied, so that sharp reducing of the temperature, which is caused by the sharply increased resistance value of the storage unit in the resetting process, is avoided, the high resistance state rapid relaxation phenomenon is effectively inhibited, and the data retention characteristic of the resistance random access memory is improved.

It should be noted that before the reset voltage is applied to the storage unit in the resistance random access memory array, for example, the preset target resistance value in the high resistance state is set for the resistance random access memory array. The preset target resistance value in the high resistance state is a resistance value of the storage unit which is capable of being reached by loading the reset voltage, and the preset target resistance value in the high resistance state, for example, is known before the method is implemented. For example, the preset target resistance value in the high resistance state is set to be same for all storage units in a same resistance random access memory array. For example, for the same resistance random access memory array, the voltages for respectively enabling the storage units to reach the high resistance state has a little difference.

In addition, the initial reset voltage applied to the storage unit of the resistance random access memory array, for example, is determined according to a voltage required for enabling the storage unit to be in the high resistance state. In other words, the initial reset voltage is selected to ensure that as many storage units as possible reach the preset target resistance value in the high resistance state so as to improve working efficiency of the resistance random access memory array and reduce energy consumption.

The set voltage applied to the storage unit, for example, needs to ensure that a resistance variable element in the storage unit is not broken down. The preset target resistance value of the storage unit in the low resistance state, for example, is a resistance value capable of being reached by applying the reverse set voltage to the storage unit, and for example, the preset target resistance value in the low resistance state is set to be same for all storage units in the same resistance random access memory array. In the embodiments of the present disclosure, the preset target resistance value of the storage unit in the low resistance state is not specially limited, as long as the storage unit is guaranteed to be in the low resistance state and not to be broken down after being applied with the set voltage. For example, the preset target resistance value of the storage unit in the low resistance state is set so that a target resistance value R1 of the resistance variable element in the storage unit in the low resistance state is slightly less than a resistance value R2 of the resistance variable element in the storage unit after the resistance variable element is activated. For example, R1 is greater than or equal to 90% of R2 (R1≥90% R2) so as to improve the data retention characteristic of the resistance random access memory better. By applying the reverse set voltage to the storage unit, a case that the voltage of the storage unit is approximate to a critical voltage is avoided, and the data retention characteristic of the resistance random access memory array is improved.

The reset voltage applied to the storage unit after the initial reset voltage for example is set in a mode of adding a step length to the initial reset voltage. For example, after a first set operation of applying the set voltage, the amount of the reset voltage applied to the storage unit is equal to a voltage value obtained by adding an amount of the initial reset voltage with one step length; after a second set operation of applying the set voltage, the amount of the reset voltage applied to the storage unit is equal to a voltage value obtained by adding an amount of a previous reset voltage with one step length; and so on. By applying the gradually increased reset voltage to the storage unit which does not reach the preset target resistance value in the high resistance state (for example, during each cycling, one step length is increased, i.e., an added value of the reset voltage is equal to n step lengths, and n is greater than or equal to 1), more storage units reach the preset target resistance value in the high resistance state. For example, the step length needs to be determined according to uniformity of the storage units in the resistance random access memory, and for example, if the storage units in the resistance random access memory are better in uniformity, the step length is set to be smaller. On the contrary, if the storage units in the resistance random access memory are poorer in uniformity, the step length is set to be larger. For example, a relationship of the step length h and the initial reset voltage Vs meets that: $0.02\,Vs \le h \le 0.2Vs$, so as to avoid the resistance state relaxation phenomenon of the resistance random access memory better.

In the embodiments of the present disclosure, a nonlinear gating device of the storage unit, for example, is a transistor. The reset voltage is applied by a word line end and a source line end of the storage unit, the set voltage is applied by the word line end and a bit line end of the storage unit, the word line end of the storage unit is connected with a word line, the source line end of the storage unit is connected with a source line, and a bit line end of the storage unit is connected with a bit line. In the embodiments of the present disclosure, for example, the operation method of the resistance random access memory further includes steps of: if the resistance value of the storage unit is less than the preset target resistance value in the high resistance, judging whether the reset voltage is greater than a maximum voltage of the source line; if the reset voltage is not greater than the maximum voltage of the source line, applying the set voltage to the storage unit; and if the reset voltage is greater than the maximum voltage of the source line, ending the method. For example, the operation method of the resistance random access memory according to the embodiments further includes: if the reset voltage is greater than the maximum voltage of the source line, determining that the storage unit does not pass the test, and ending the method.

Figure 5:
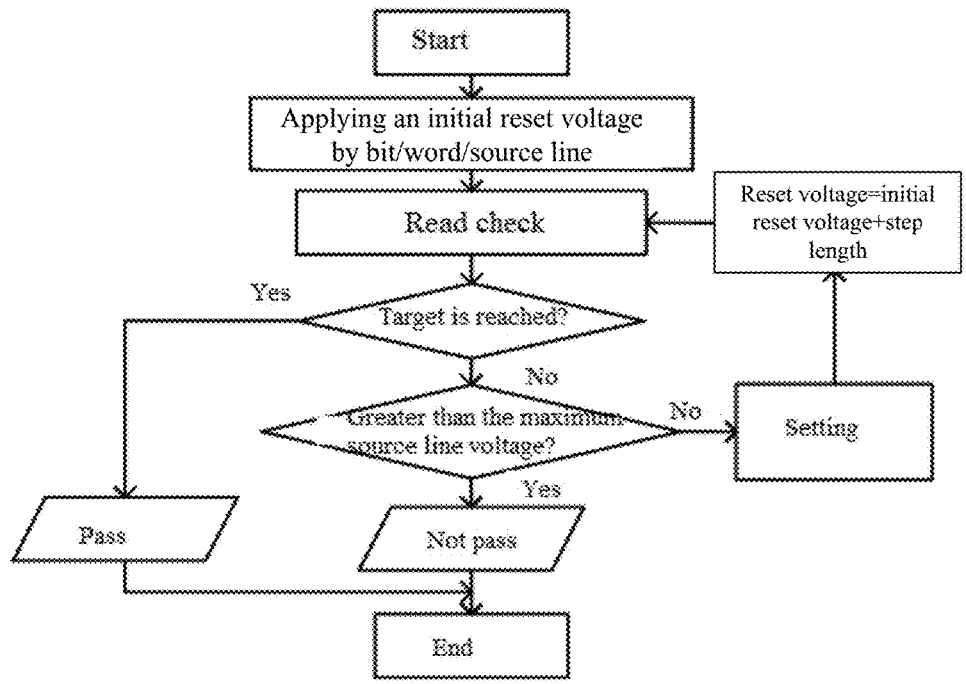
FIG. 5 is a flow chat of the reset operation of the resistance random access memory using a transistor as a nonlinear gating device according to the embodiments of the present disclosure.

FIG. 5 shows a flow chat of the reset operation of the resistance random access memory using the transistor as the nonlinear gating device in the embodiments of the present disclosure.

With reference to FIG. 5, the reset operation is started so that the initial reset voltage is applied by the word line and the source line of the resistance random access memory array, i.e., the initial voltage is applied to the storage unit. For example, the reset voltage is a pulse voltage. And then, the resistance value of the storage unit is acquired by the read check operation, and it is judged whether the resistance value of the storage unit reaches the preset target resistance value in the high resistance state. If the resistance value of the storage unit reaches the preset target resistance value in the high resistance state, it is determined that the test is passed, and the test is ended, i.e., application of, for example, the pulse voltage to the storage unit is stopped. If the resistance value of the storage unit does not reach the preset target resistance value in the high resistance state, whether the rest voltage applied to the storage unit is greater than the maximum voltage of the source line is further judged. If the rest voltage applied to the storage unit is greater than the maximum voltage of the source line, it is determined that the test is not passed, and application of, for example, the pulse voltage to the storage unit is stopped. If the rest voltage applied to the storage unit is not greater than the maximum voltage of the source line, for example, the reverse set voltage is applied by the word line end and the bit line end of the storage unit so that the storage unit is subjected to the set operation so as to set the storage unit to the preset target resistance value in the low resistance state; and then, according to the voltage of the source line and the step length, the reset voltage obtained by increasing the amount of the initial reset voltage by one step length is applied to the storage unit. The read check operation and the subsequent operations are repeated, until the resistance value of the storage unit reaches the preset target resistance value in the high resistance state, or until the voltage applied to the storage unit is greater than the voltage of the source line and the test is ended.

In the embodiments of the present disclosure, the nonlinear gating device of the storage unit, for example, is the transistor, and the reset voltage is the pulse voltage applied by the word line end and the source line end of the storage unit.

For example, the initial reset voltage is the pulse voltage, a pulse width of the pulse voltage is 20 to 100 ns, e.g., 40 to 60 ns, so as to enable the storage unit to rapidly reach the high resistance state and reduce energy consumption.

The amount of the initial reset voltage is set by considering uniformity of the resistance random access memory array. Namely, after the initial reset voltage is applied, as many storage units as possible should be guaranteed to reach the preset target resistance value in the high resistance state. However, the amount of the pulse voltage should be not greater than a maximum value of critical voltages of the storage units in the resistance random access memory array.

For example, the initial reset voltage is the pulse voltage, the amount of the pulse voltage is set as a voltage value for achieving that 60% of the storage units reach the preset target resistance value, so as to ensure that more storage units reach their respective critical voltages after the initial pulse voltage is applied, thereby avoiding the relaxation phenomenon.

For example, the initial reset voltage is the pulse voltage, a difference between an amount $V_{max}$ of the pulse voltage and a median $V_{mid}$ of the critical voltages of the storage units of the resistance random access memory array meets that: $-0.2V \leq V_{max} - V_{mid} \leq 0.1V$, so as to ensure that more storage units reach the preset target resistance value after the initial pulse voltage is applied, thereby avoiding the relaxation phenomenon.

In the embodiments of the present disclosure, the read check operation is that: a pulse voltage with an amount of 0.1 to 0.3 V is sent to the storage unit, a current of the storage unit is acquired, and the resistance value of the storage unit is calculated based on the pulse voltage and the current. During the read check operation is carried out, if the pulse voltage is excessively low, the resistance value of the storage unit may not be accurately measured; and if the pulse voltage is excessively high, circuit crosstalk may occur. Therefore, by setting the pulse voltage for the read check operation to be 0.1 to 0.3 V, not only the resistance value of the storage unit is accurately measured, but also circuit crosstalk is effectively prevented. For example, the pulse voltage for the read check operation is set to be 0.2 to 0.25 V, so that the detection accuracy of the resistance value is further improved. By accurately measuring the resistance value of the storage unit in the access memory array, a foundation is laid for the subsequent steps so as to avoid the relaxation phenomenon better.

It should be noted that for the resistance random access memory array using the transistor as a switch, the read check operation, for example, is implemented by applying the pulse voltage for the read check operation by the word line and the bit line of the resistance random access memory array.

In the embodiments of the present disclosure, the nonlinear gating device of the storage unit is the transistor. The set operation of applying the set voltage is that: the set voltage is applied by the bit line end of the storage unit. For example, for the resistance random access memory adopting the transistor, pulse voltages are simultaneously applied by the word line end and the bit line end of the storage unit so as to implement the set operation. In the embodiments of the present disclosure, for the storage unit which does not reach the preset target resistance value in the high resistance state after the initial set voltage is applied, the set operation of applying the set voltage is implemented, so that the high resistance state rapid relaxation phenomenon is avoided better.

In the embodiments of the present disclosure, by adjusting a relationship between an amount of the set voltage in the set operation and an amount of the reset voltage, the resistance state relaxation phenomenon of the resistance random access memory is avoided better. For example, the amount V2 of the set voltage applied to the storage unit and the amount V1 of the reset voltage applied to the storage unit before the set operation of applying the set voltage with the amount V2 meet that: $-0.4 \leq V2-V1 \leq 0$. For example, the amount V2 of the set voltage applied to the storage unit and the amount V1 of the reset voltage applied to the storage unit before the set operation of applying the set voltage with the amount V2 meet that: $-0.2 \leq V2-V1 \leq 0$, so as to further reduce the resistance state relaxation of the resistance random access memory.

It should be pointed out that the preset target resistance value of the storage unit in the low resistance state in the set operation is achieved by cyclically loading the pulse voltage to the storage unit after the initial set voltage value and the step length are set. Herein, the resistance value of the storage unit in the low resistance state also needs to be determined by the read check judgment, i.e., by acquiring a current value of the storage unit and by considering the voltage applied to the storage unit, the resistance value of the storage unit is calculated out. Moreover, according to the calculated resistance value of the storage unit, an operation of continuously applying the pulse voltage or stopping applying the pulse voltage is executed.

In another aspect, the embodiments of the present disclosure provide a resistance random access memory array apparatus, which effectively avoids the resistance state relaxation phenomenon of the resistance random access memory array. The apparatus includes the resistance random access memory array, a control module and a test module. For example, the control module is a control circuit, and the test module is a test circuit.

For example, the control module sends an instruction of applying a reset voltage to a storage unit in the resistance random access memory array to the test module, and controls the test module to apply the reset voltage to the storage unit.

For example, the control module acquires a resistance value of the storage unit, compares the acquired resistance value of the storage unit with a preset target resistance value in a high resistance state, and carries out the following steps according to a comparison result:

If the resistance value of the storage unit is less than the preset target resistance value in the high resistance state, the control module sends an instruction of applying a set voltage to the test module and controls the test module to apply the set voltage to the storage unit so as to set the storage unit to a preset target resistance value in a low resistance state; the control module sends an instruction of applying the reset voltage of which an amount is increased to the test module and controls the test module to apply the reset voltage of which the amount is increased to the storage unit; and the control module and the test module repeat the step of acquiring the resistance value of the storage unit and the subsequent steps until the resistance value of the storage unit is greater than or equal to the preset target resistance value in the high resistance state.

If the resistance value of the storage unit is greater than or equal to the preset target value in the high resistance state, the control module controls the test module to stop applying the reset voltage to the storage unit.

In the embodiments of the present disclosure, for example, the storage unit includes a resistance variable element and a nonlinear gating device, and the nonlinear gating device is a transistor; and the reset voltage is applied by a word line end and a source line end of the storage unit, the set voltage is applied by the word line end and a bit line end of the storage unit, the word line end of the storage unit is connected with a word line, the source line end of the storage unit is connected with a source line, and the bit line end of the storage unit is connected with a bit line. In the embodiments of the present disclosure, the control module and the test module for example carry out the following steps: if the resistance value of the storage unit is less than the preset target resistance value in the high resistance state, the control module judges whether the reset voltage is greater than a maximum voltage of the source line, if the reset voltage is not greater than the maximum voltage of the source line, the control module controls the test module to apply the set voltage to the storage unit, and if the reset voltage is greater than the maximum voltage of the source line, the control module controls the test module to stop applying the reset voltage to the storage unit; and if the reset voltage is greater than the maximum voltage of the source line, the control module determines that the storage unit does not pass the test, and the test is ended.

Figure 6:
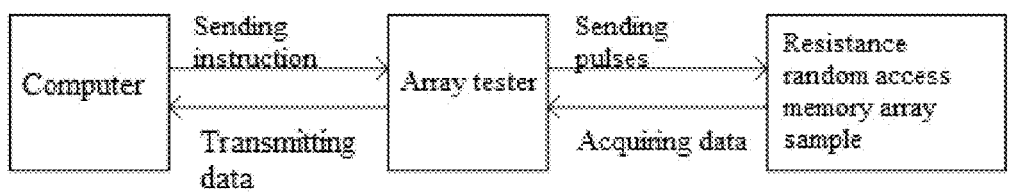
FIG. 6 is a resistance random access memory apparatus according to the embodiments of the present disclosure.

FIG. 6 shows the resistance random access memory apparatus according to the embodiments of the present disclosure. With reference to FIG. 6, the control module for example is a computation device of a computer, and the test module for example is an array tester. The computer sets various parameters, for example, inputs the preset target resistance value in the high resistance state and inputs the preset target resistance value in the low resistance state, sets the reset voltage and the set voltage (the reset voltage and the set voltage for example are pulse voltages), sets the read check pulse voltage and the like, and sends instructions to the array tester. For example, the array tester sends the pulse voltage for implementing the read check operation to the resistance random access memory array, and acquires related data (e.g., current) of the storage unit in the resistance random access memory array and transmits the data to the computer; and the computer carries out corresponding processing according to the data, and determines subsequent operations and the like, e.g., operations of comparing the resistance value of the storage unit with the preset target resistance value in the high resistance state and determining to apply the set voltage to the storage unit or stop applying the reset voltage to the storage unit and the like according to a comparison result.

For example, the control module acquires the resistance value of the storage unit as follows: the control module controls the test module to send the pulse voltage of which an amount is 0.1 to 0.3 V to the storage unit; the test module acquires the current of the storage unit in the resistance random access memory array, and transmits the acquired current to the control module; and the control module calculates the resistance value of the storage unit based on the pulse voltage and the acquired current.

For example, the amount of the pulse voltage sent to the storage unit by the test module under the control of the control module is 0.2 to 0.25 V so as to further improve detection accuracy and avoid circuit crosstalk.

In the embodiments of the disclosure, the nonlinear gating device of the storage unit for example is the transistor or a diode.

In the embodiments of the disclosure, the resistance random access memory apparatus according to the embodiments of the present disclosure includes the resistance random access memory array, the control module and the test module. For example, the control module includes an Input/Output (I/O) interface, and an operator carries out the setting of the above parameters by the interface. The test module, for example, executes corresponding operations according to received instructions from the control module, e.g. operations of providing the initial pulse reset voltage and the like. The control module and the test module are not necessarily modules which are independent from each other, as long as the control module and the test module have the functions as mentioned above.

The inventors of the present disclosure carry out verification on the technical effects of the embodiments of the present disclosure by experiments as described below.

A structure of the to-be-tested access memory array adopts the structure as shown in FIG. 1. Namely, the resistance random access memory array includes 8 word lines/source lines and 128 bit lines, and one storage unit is arranged at each intersection of the word line/source line and the bit line. A structure of the storage unit of the resistance random access memory array is as shown in FIG. 2. Namely, the storage unit, for example, includes the resistance variable element and the transistor. The gate electrode of the transistor is connected with the word line, the source electrode of the transistor is connected with the source line, and the drain electrode of the transistor is connected to the bit line after being connected in series with the resistance variable element.

In the experiment process, the reset method shown in FIG. 3 and the reset method shown in FIG. 5 according to the embodiments of the present disclosure are respectively used for carrying out the reset operation on the resistance random access memory array. After the reset operation on the resistance random access memory array is completed, a resistance value of each storage unit of the resistance random access memory array in an initial state and a resistance value of each storage unit of the resistance random access memory array after heating is carried out for 2 hours at a temperature of 175° C. are tested.

Figure 7:
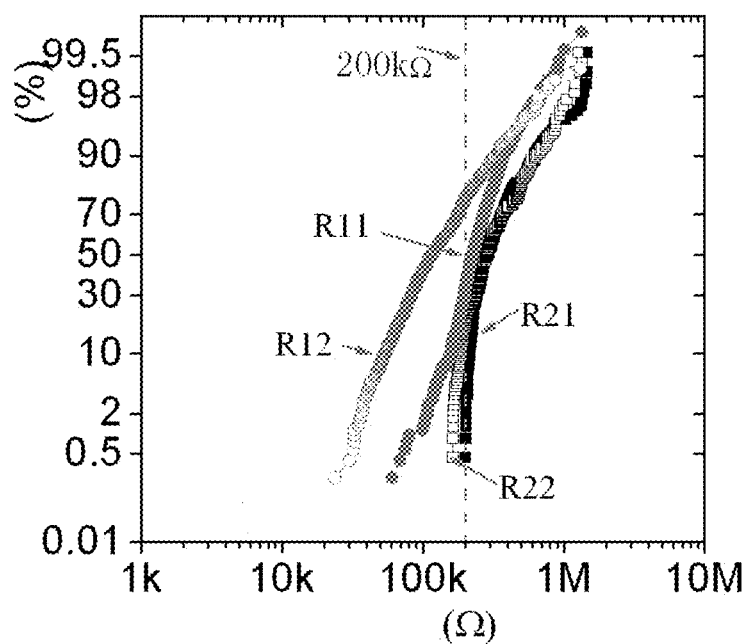
FIG. 7 is a graph of accumulative probability distribution of resistance values of storage units of the resistance random access memory array respectively adopting an existing reset method and the reset method according to the embodiments of the present disclosure.

FIG. 7 is a graph of accumulative probability distribution of the resistance values of the storage units of the resistance random access memory array respectively adopting the reset method shown in FIG. 3 and the reset method shown in FIG. 5 according to the embodiments of the present disclosure. An abscissa in FIG. 7 represents the resistance value of each storage unit in the resistance random access memory array, has the unit of ohm (SZ); and an ordinate in FIG. 7 represents accumulative probability distribution of the resistance values of the storage units in the resistance random access memory array. In the drawing, R11 and R12 respectively indicate accumulative probability distribution lines of the resistance values of the storage units by adopting an existing reset method shown in FIG. 3 before and after heating. R21 in the drawing and R22 in the drawing respectively indicate accumulative probability distribution lines of the resistance values of the storage units by adopting the reset method of the embodiments of the present disclosure before and after heating. 200 kΩ in the drawing is the preset target resistance value in the high resistance state set for the resistance random access memory.

With reference to FIG. 7, it can be known that after the reset method shown in FIG. 3 is adopted to carry out the reset operation on the resistance random access memory array, the resistance values of about 10% of the storage units do not reach the preset target resistance value in the high resistance state, and the resistance values of part of the storage units are lower than 100 KΩ; and after heating is carried out for 2 hours, the resistance values of more than 70% of the storage units are less than the preset target resistance value in the high resistance state. The resistance values of part of the storage units have been reduced to over 10 times of the preset target resistance value so as to cause disappearance of the window between the high resistance state and the low resistance state, i.e., part of the resistance variable elements fail. However, under the same conditions, after the method shown in FIG. 5 according to the embodiments of the present disclosure is adopted to carry out the reset operation on the resistance random access memory array, the resistance values of nearly all the storage units of the resistance random access memory array are greater than the preset target resistance value of 200 KΩ. Moreover, with further reference to FIG. 7, after heating is carried out for 2 hours, the resistance values of only about 2% of the storage units are less than the preset target resistance value of 200 KΩ, and the resistance values of those storage units are also approximate to 200 KΩ. Therefore, it can be known that by adopting the reset method of the embodiments of the present disclosure, data retention of the resistance random access memory array is obviously improved.

It should be noted that the above-mentioned experiment conditions and results merely aim to illustrate the effect of the embodiments of the present disclosure for improving data retention of the resistance random access memory, but are not intended to limit the present disclosure. Those skilled in the art should know that when the above-mentioned experiment conditions are changed without departure from the essential intension of the present disclosure, the conclusion capable of proving the effect of the present disclosure can still be obtained.

It should be noted that the resistance random access memory apparatus of the embodiments of the present disclosure can be implemented in a mode of software, firmware and necessary universal hardware, and of course, can also be implemented by special hardware; but in many cases, the former may be the preferred implementation mode. Based on such understanding, the technical solution of the embodiments of the present disclosure is achieved by software, hardware, firmware or a random combination thereof; for example, the software product is stored in a readable memory medium, e.g., a magnetic memory medium (for example, a hard disk) or an electronic memory medium (for example, a ROM and a flash memory) and the like, and includes a plurality of instructions for enabling the device (which may be a computer, a server or a network device and the like) to execute the method in the embodiments of the present disclosure.

The foregoing embodiments merely are exemplary embodiments of the disclosure, and not intended to define the scope of the disclosure, and the scope of the disclosure is determined by the appended claims.

The invention claimed is:

1. An operation method of a resistance random access memory, the method comprising:
    applying an initial reset voltage to a storage unit of a resistance random access memory array, wherein the storage unit includes a variable resistance element and a nonlinear gating device comprising a transistor, and the reset voltage is applied by a word line end and a source line end of the storage unit, the word line end of the storage unit being connected with a word line, the source line end of the storage unit being connected with a source line, and a bit line end of the storage unit being connected with a bit line;
    carrying out a read check operation to acquire a resistance value of the storage unit;
    determining that the resistance value of the storage unit is either less than, or higher than or equal to a preset target resistance value in a high resistance state;
    responsive to determining that the resistance value of the storage unit is higher than or equal to the preset target resistance value in the high resistance state, terminating the operation of the resistance random access memory; and
    responsive to determining that the resistance value of the storage unit is less than the preset target resistance value in the high resistance state,
        applying a set voltage to the storage unit to set the storage unit to a preset target resistance value in a low resistance state,
        updating the reset voltage applied to the storage unit, wherein a magnitude of the updated reset voltage is higher than that of the initial reset voltage, and
        repeating (i) the read check operation, and (ii) determining whether the resistance value of the storage unit has reached the preset target resistance value in the high resistance state until the storage unit reaches the preset target resistance value in the high resistance state,
        wherein updating the reset voltage further comprises:
            determining whether the reset voltage is higher than a maximum voltage of the source line,
            if the reset voltage is less than or equal to the maximum voltage of the source line, applying the set voltage to the storage unit, and
            if the reset voltage is higher than the maximum voltage of the source line, terminating the operation of the resistance random access memory.

2. The operation method of the resistance random access memory according to claim 1, wherein if the reset voltage of the storage unit is higher than the maximum voltage of the source line, terminating the operation of the resistance random access memory responsive to determining that the storage unit does not pass test.

3. The operation method of the resistance random access memory according to claim 1, wherein updating the reset voltage comprises applying a voltage that is equal to a sum of the initial reset voltage and a step length.

4. The operation method of the resistance random access memory according to claim 1, wherein the initial reset voltage is a pulse voltage, and a pulse width of the pulse voltage is 20 to 100 ns.

5. The operation method of the resistance random access memory according to claim 4, wherein the pulse width of the pulse voltage is 40 to 60 ns.

6. The operation method of the resistance random access memory according to claim 1, wherein the resistance random access memory array includes a plurality of storage units, the initial reset voltage is a pulse voltage, and a magnitude of the pulse voltage is less than a maximum value of critical voltages of the plurality of storage units.

7. The operation method of the resistance random access memory according to claim 1, wherein the resistance random access memory array includes a plurality of storage units, the initial reset voltage is a pulse voltage, and a difference between an amount $V_{max}$ of the pulse voltage and a median $V_{mid}$ of critical voltages of the plurality of storage units is such that that: $-0.217 \leq V_{max} - V_{mid} \leq 0.1V$.

8. The operation method of the resistance random access memory according to claim 1, wherein carrying out the read check operation comprises:
applying a pulse voltage of magnitude range 0.1 to 0.3 V to the storage unit;
obtaining a value of a current of the storage unit; and
calculating the resistance value of the storage unit based on the pulse voltage and the current.

9. The operation method of the resistance random access memory according to claim 8, wherein the magnitude range of the pulse voltage is 0.2 to 0.25 V.

10. The operation method of the resistance random access memory according to claim 1, wherein the set voltage is applied by the word line end and the bit line end of the storage unit.

11. The operation method of the resistance random access memory according to claim 1, wherein an amount V2 of the set voltage is applied to the storage unit and an amount V1 of the reset voltage is applied to the storage unit before application of the set voltage with the amount V2, and wherein $0.4 \leq V2-V1 \leq 0$.

12. The operation method of the resistance random access memory according to claim 11, wherein $-0.2 \leq V2-V1 \leq 0$.

13. The operation method of the resistance random access memory according to claim 1, wherein if the resistance value of the storage unit is equal to the preset target resistance value in the high resistance state, it is determined that the storage unit passes test and the operation of the resistance random access memory is terminated.

14. A resistance random access memory apparatus, comprising a resistance random access memory array, a control module and a test module, wherein
the control module controls the test module to apply a reset voltage to a storage unit of the resistance random access memory array; and
the control module acquires a resistance value of the storage unit, compares the acquired resistance value of the storage unit with a preset target resistance value in a high resistance state, and carries out the following steps according to a comparison result:
if the resistance value of the storage unit is less than the preset target resistance value in the high resistance state, the control module controls the test module to apply a set voltage to the storage unit so as to set the storage unit to a preset target resistance value in a low resistance state; the control module controls the test module to apply the reset voltage of which an amount is increased to the storage unit; and the control module and the test module repeat the step of acquiring the resistance value of the storage unit and the subsequent steps until the resistance value of the storage unit is greater than or equal to the preset target resistance value in the high resistance state; and
if the resistance value of the storage unit is greater than or equal to the preset target resistance value in the high resistance state, the control module controls the test module to stop applying the reset voltage to the storage unit.

15. The resistance random access memory apparatus according to claim 14, wherein the storage unit includes a variable resistance element and a nonlinear gating device comprising a transistor, the reset voltage is applied by a word line end and a source line end of the storage unit, the set voltage is applied by the word line end and a bit line end of the storage unit, the word line end of the storage unit is connected with a word line, the source line end of the storage unit is connected with a source line, and the bit line end of the storage unit is connected with a bit line.

16. The resistance random access memory apparatus according to claim 15, wherein if the resistance value of the storage unit is less than the preset target resistance value in the high resistance state, the control module
determines whether the reset voltage is higher than a maximum voltage of the source line,
if the reset voltage is less than or equal to the maximum voltage of the source line, the control module controls the test module to apply the set voltage to the storage unit, and
if the reset voltage is higher than the maximum voltage of the source line, the control module controls the test module to stop applying the reset voltage to the storage unit.

17. The resistance random access memory apparatus according to claim 16, wherein if the reset voltage is higher than the maximum voltage of the source line, the control module determines that the storage unit does not pass test and the test is ended.

18. The resistance random access memory apparatus according to claim 14, wherein the storage unit includes a variable resistance element and a nonlinear gating device comprising a transistor or a diode.

19. An operation method of a resistance random access memory, the method comprising:
applying an initial reset voltage to a storage unit of a resistance random access memory array;
carrying out a read check operation to acquire a resistance value of the storage unit;
determining that the resistance value of the storage unit is either less than, or higher than or equal to a preset target resistance value in a high resistance state;
responsive to determining that the resistance value of the storage unit is higher than or equal to the preset target resistance value in the high resistance state, terminating the operation of the resistance random access memory; and responsive to determining that the resistance value of the storage unit is less than the preset target resistance value in the high resistance state, applying a set voltage to the storage unit to set the storage unit to a preset target resistance value in a low resistance state, updating the reset voltage applied to the storage unit, wherein a magnitude of the updated reset voltage is higher than that of the initial reset voltage, and repeating (i) the read check operation, and (ii) determining whether the resistance value of the storage unit has reached the preset target resistance value in the high resistance state until the storage unit reaches the preset target resistance value in the high resistance state, wherein an amount V2 of the set voltage is applied to the storage unit and an amount V1 of the reset voltage is applied to the storage unit before application of the set voltage with the amount V2, and wherein: $-0.4 \leq V2-V1 \leq 0$.

* * * * *